United States Patent
Cappellani et al.

(10) Patent No.: US 6,835,612 B2
(45) Date of Patent: Dec. 28, 2004

(54) METHOD FOR FABRICATING A MOSFET HAVING A VERY SMALL CHANNEL LENGTH

(75) Inventors: Annalisa Cappellani, Portland, OR (US); Ludwig Dittmar, Dresden (DE); Dirk Schumann, Schönfliess (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/673,705

(22) Filed: Sep. 26, 2003

(65) Prior Publication Data

US 2004/0157380 A1 Aug. 12, 2004

Related U.S. Application Data

(63) Continuation of application No. PCT/DE02/00732, filed on Feb. 28, 2002.

(30) Foreign Application Priority Data

Mar. 26, 2001 (DE) .......................................... 101 14 778

(51) Int. Cl.[7] ..................... H01L 21/336; H01L 21/3205
(52) U.S. Cl. ....................... 438/197; 438/299; 438/301; 438/585
(58) Field of Search .............................. 438/197, 299, 438/301, 303, 305, 306, 585, 592, 595

(56) References Cited

U.S. PATENT DOCUMENTS

| 5,089,863 | A | 2/1992 | Satoh et al. |
| 5,384,479 | A | 1/1995 | Taniguchi |
| 6,091,120 | A | 7/2000 | Yeom et al. |
| 6,277,699 | B1 | 8/2001 | Chen et al. |

FOREIGN PATENT DOCUMENTS

| DE | 42 34 528 C2 | 4/1993 |
| DE | 42 34 777 A1 | 4/1994 |
| EP | 0 328 350 A2 | 8/1989 |
| EP | 0 740 334 A2 | 10/1996 |
| FR | 2 791 177 A1 | 9/2000 |
| JP | 63044768 | 2/1988 |
| WO | 02/41383 A1 | 5/2002 |

OTHER PUBLICATIONS

Widmann, D. et al.: "Technologie hochintegrierter Schaltungen" [Technology of High-Density Integrated Circuits], Springer Verlag, 2nd Edition, pp. 201–203.
Ghani, T. et al.: "100nm Gate Length High Performance/Low Power CMOS Transistor Structure", IEEE, 1999, pp. 415–418.
Lasky, J. B. et al.: "Comparison of Transformation to Low–Resistivity Phase and Agglomeration of $TiSl_2$ and $CoSi_2$", IEEE Transactions on Electron Devices, vol. 38, No. 2, Feb. 1991, pp. 262–269.
Hisamoto, D. et al.: "A Low–Resistance Self–Aligned T–Shaped Gate for High–Performance Sub–0.1–$\mu$m CMOS", IEEE Transactions on Electron Devices, vol. 44, No. 6, Jun. 1997, pp. 951–956.
Kasai, K. et al.: "W/WNx/Poly–Si Gate Technology for Future High Speed Deep Submicron CMOS LSIS", IEEE, 1994, PP. 497–500.

*Primary Examiner*—David Zarneke
*Assistant Examiner*—Scott B. Geyer
(74) *Attorney, Agent, or Firm*—Laurence A. Greenberg; Werner H. Stemer; Gregory L. Mayback

(57) ABSTRACT

A gate layer stack formed with at least two layers is firstly patterned anisotropically and then the lower layer is etched. An isotropic, preferably selective etching step effects a lateral undercutting, i.e. removal of the lower layer as far as the predetermined channel length to form a dimensionally accurate T-gate transistor with a very short channel length.

13 Claims, 1 Drawing Sheet

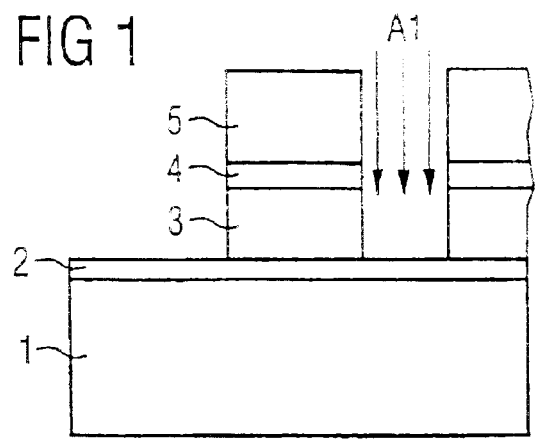
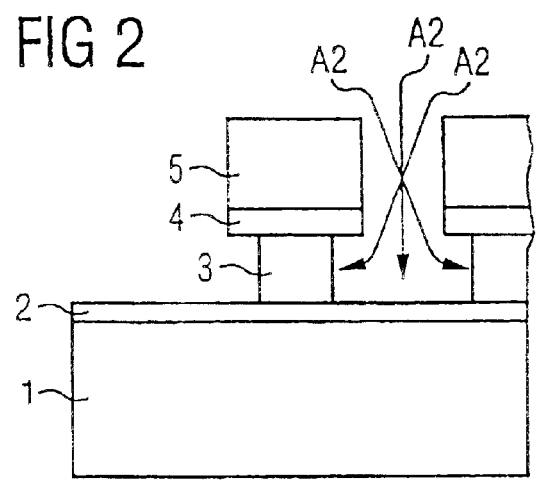
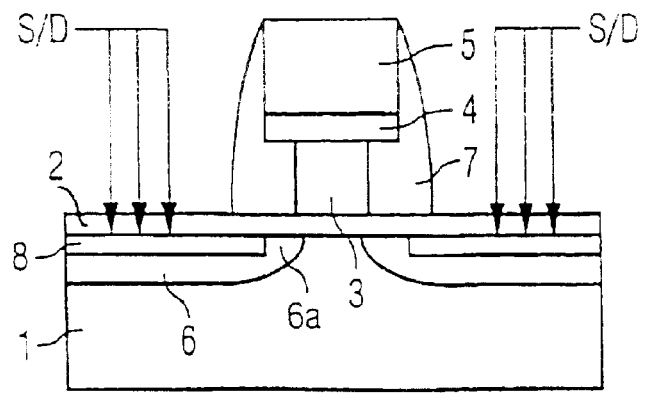

METHOD FOR FABRICATING A MOSFET HAVING A VERY SMALL CHANNEL LENGTH

CROSS-REFERENCE TO RELATED APPLICATION

This application is a continuation of copending International Application No. PCT/DE02/00732, filed Feb. 28, 2002, which designated the United States and which was not published in English.

BACKGROUND OF THE INVENTION

Field of the Invention

The present invention relates to a method for fabricating a MOSFET having a gate channel of a predetermined, very small channel length.

With conventional technologies, it is only with difficulty that transistors having gate channel lengths of below 100 nm, so-called short-channel transistors in the sub-: range, can be fabricated so exactly that the required electrical operating parameters are complied with. A high performance of the transistor presupposes, for example, a high operating current with a low power consumption and also only a low leakage current in the off state. Furthermore, the gate resistance and parasitic effects such as the Miller capacitance are intended to be as small as possible.

This requires dimensionally accurate dimensions and proportions of the transistor, which is formed by the sequence of many process steps. Particular difficulties are posed at the present time by the fabrication of T-shaped gate layer stacks whose lower layer, in accordance with the desired channel length, is very narrow in comparison with the upper layer of the gate layer stack.

Various methods have been proposed for fabricating T-gate transistors. Thus, e.g. the fabrication of a T-gate in which a metal layer is subsequently deposited onto a preformed polysilicon gate is known. On account of positional errors between the layers, however, it is necessary to increase the distance between the source/drain contacts and the gate in order to ensure entirely satisfactory operation of the transistor even in the event of a misalignment. However, this entails an increased source/drain resistance.

A short-channel transistor is described e.g. by Ghani, Ahmed et al., IEDM 99, page 415. Furthermore, D. Hisamoto et al. (IEEE Transaction on Electronic Devices, Vol 44, 6, 97, page 951) describe a method for fabricating a self-aligned T-gate with a tungsten layer on an underlying first gate layer.

Moreover, Kasai et al. (IEDM 94, pages 497–98) describe a method for fabricating a T-gate in which the gate layer stack comprises polysilicon, a diffusion barrier and a metal layer deposited one above the other.

It is disadvantageous in the latter methods that the short-channel gate has to be structured with the aid of complicated lithographic methods, for instance with the aid of an electron beam.

SUMMARY OF THE INVENTION

It is accordingly an object of the invention to provide a method for fabricating a MOSFET with very small channel length which overcomes the above-mentioned disadvantages of the heretofore-known devices and methods of this general type and wherein the method enables a T-gate transistor with a very short channel length to be fabricated dimensionally accurately, in a very simple manner and cost-effectively.

With the foregoing and other objects in view there is provided, in accordance with the invention, a method for fabricating a MOSFET with a gate channel of a predetermined, very small channel length. The method comprises the following steps:

producing a dielectric on a semiconductor substrate;

applying a first gate layer to the dielectric, the first gate layer comprising polysilicon;

forming an intermediate layer, preferably of tungsten nitride, to serve as a diffusion barrier, on the first gate layer;

applying a second gate layer, the second gate layer comprising tungsten;

masking the second gate layer to define a width of the second gate layer to be greater than the predetermined channel length;

anisotropically etching the second gate layer, the intermediate layer, and the first gate layer;

isotropically laterally undercutting the first gate layer under the second gate layer selectively with respect to the dielectric, with respect to the intermediate layer, and with respect to the second gate layer, thereby utilizing an etching gas containing hydrogen bromide in a dry etching process, and controlling the etching process for forming the first gate layer with a predetermined width less than the width of the second gate layer and corresponding to the predetermined channel length.

According to the invention, various etching steps having different degrees of isotropy are combined with one another in a suitable manner in order to obtain the desired T-shaped structure of the gate. Firstly, the gate layer stack is etched anisotropically, thereby patterning it. The gate thus formed is still significantly wider than the predetermined channel length.

In contrast to conventional methods, there is no attempt firstly to form a lower gate layer with the same width as the predetermined channel length, rather, according to the invention, firstly a layer stack is produced which is wider and can therefore be formed with the aid conventional inexpensive lithography steps. This makes the method particularly cost-effective.

Firstly, the second gate layer is masked in such a way that its width is greater than the predetermined channel length; i.e. the masking is effected in such a way that after the hereinafter first etching step, a layer stack is produced which comprises the first and second gate layers and has a width which is greater than the predetermined channel length.

The further processing of the gate layer stack in order to achieve the small gate length corresponding to the predetermined channel length is then effected by subsequent etching of the lower gate layer from the side.

To that end, according to the invention, a second etching step is carried out. In order to reach the first gate layer concealed by the second gate layer, the second etching is carried out isotropically. On account of this isotropy, the second etching brings about a lateral constriction of the first gate layer, which is narrowed in a controlled manner down to the predetermined channel length. In this case, the short-channel gate thus obtained is produced with the aid of simple process steps known per se, without complicated methods being employed.

A preferred embodiment provides for the width of the first gate layer to be controlled by the width of the second gate layer and by the duration of the controlled lateral undercutting of the first gate layer under the second gate layer. In the simplest case, the concentration of etchants and other parameters of the undercutting remain constant, so that only the time duration of this etching determines the lower gate length. In this case, the predetermined width of the first gate layer is preferably equal to the predetermined channel length.

One development of the invention provides for the width of the first gate layer to be controlled during the undercutting with the aid of the concentration of an etchant. In this case, the concentration can be set to a value which is constant during the etching, or else be altered in the course of the etching.

The predetermined width of the first gate layer is preferably equal to the predetermined channel length. On the other hand, deviations of 10% in both directions also still lie within the scope of the invention.

It is preferably provided that the anisotropic etching of the second and of the first gate layer is continued until the dielectric is reached. The sidewall produced during the isotropic etching becomes particularly uniform as a result. On the other hand, the first, isotropic etching can also be ended within the lower gate layer and the second, isotropic etching can be begun there. In this case, the dielectric is not reached until during the second etching.

Finally, it is provided that the first gate layer is isotropically laterally undercut selectively with respect to the second gate layer. As a result, the upper dimensions of the gate line are preserved and can thus be contact-connected more easily.

The undercutting is preferably carried out with the aid of an isotropic plasma etching step. In this case, conventional dry etching chambers with inductive or other coupling-in are implied.

A hydrogen halide preferably serves as etching gas for the isotropic etching; hydrogen bromide, in particular, is advantageous owing to its good selectivity with respect to metals.

With regard to the dimensions of the T-gate that is fabricated, preferred embodiments provide for the width of the second gate layer to be between 120 and 300 nm and for the width of the first gate layer to between 30 and 150 nm. Transistors having a channel length of 30 to 150 nm are thus preferably fabricated.

The gate dielectric preferably contains silicon dioxide.

The second gate layer preferably has a higher electrical conductivity than the first gate layer. As a result, the overall conductivity of the gate is increased. The second gate layer preferably comprises tungsten as metal. It can be composed of tungsten.

One development of the invention provides for the introduction of source/drain implantations and the diffusion thereof under the predetermined width of the second gate layer as far as the edge of the first gate layer. In this case, the wider, upper gate layer forms part of a mask which allows the implantations to be introduced into the wafer only at a certain distance from the lower gate layer through the dielectric. The subsequent thermal distribution of the implantations is controlled in such a way that the dopants likewise cover, in addition to the width of a spacer, the difference between the widths of the second and first gate layers, i.e. the path to the predetermined small channel length.

In a preferred implementation, the MOSFET according to the invention forms a part of a DRAM or of a logic circuit.

Other features which are considered as characteristic for the invention are set forth in the appended claims.

Although the invention is illustrated and described herein as embodied in a method for fabricating a MOSFET having a very small channel length, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic side view illustrating a first process stage in the fabrication of T-gate transistors according to the invention;

FIG. 2 illustrates a second process stage; and

FIG. 3 illustrates a third process stage.

DESCRIPTION OF THE PREFERRED EMBODIMENTS

Referring now to the figures of the drawing in detail and first, particularly, to FIG. 1 thereof, there is shown a sequence of a plurality of gate layers that are deposited on a silicon substrate 1 covered with a gate oxide 2 made, preferably, of silicon dioxide. The gate layer stack thus produced substantially comprises a first gate layer 3 made of polysilicon and an overlying second gate layer 5. The second gate layer 5 serves for improving the conductivity of the gate in the case of very small dimensions and will therefore preferably be composed of a metal, in particular of tungsten.

An intermediate layer 4 made, for example, of tungsten nitride and serving as a diffusion barrier, can be produced between these layers, for instance by subsequent siliciding. Moreover, it is possible to deposit a total of more than two layers one on top of the other. What is decisive is that at least two gate layers made of different material are formed which permit a lateral undercutting of the lower layer under the upper layer of the gate.

Once the layer sequence required for the gate structure has been produced, it is patterned laterally in order to form the gate. To that end, the layer sequence or its uppermost layer 5 is firstly masked. Since this masking is effected in such a way that the width of the second gate layer 5 is wider than the predetermined channel length at this method stage, it is possible to employ conventional lithographic techniques such as, for instance, the use of resist or hard masks.

According to the invention, the initial width of the gate layer stack is deliberately chosen to be wider than would correspond to the desired gate length and thus the channel length. For this purpose, combining an anisotropic first etching with a subsequent anisotropic undercutting, which, in this order, leads to an undercutting of the first gate layer under the second gate layer, results in a reduction of the gate length directly on the gate oxide. By virtue of this combination, a T-gate with a very short channel length can be fabricated with the aid of simple etching processes known per se. The use of lasers or electron beams which are usually employed to produce very small structures is not necessary in the case of the method according to the invention. Rather, the second gate layer 5 can be masked in a customary manner with the aid of resist masks or hard masks.

The forming of the gate then begins with the anisotropic dry etching—directed in the direction perpendicular to the substrate surface—with the aid of a first etching gas, indicated by A1 in FIG. 1. The etching is preferably continued until all of the gate layers have been patterned, but the underlying dielectric has still not been perforated.

As an alternative, the etching can also be ended at a stage in which the second gate layer 5 has been completely perforated, whereas the first gate layer 3 has only been partially perforated. In this case, the first gate layer 3 is completely perforated as far as the dielectric 2 through the second etching step, described below.

In accordance with FIG. 2, in a next, isotropic etching step, a second etching gas A2 is supplied isotropically to the substrate. The term "isotropic" in this sense means that the degree of isotropy is high enough that the etching gas A2 reaches and undercuts the sidewalls of the lower gate layer 3.

The second etching must be effected selectively with respect to the dielectric 2. The greater the selectivity of the second etching with respect to the dielectric, the more reliably perforation of the dielectric is prevented.

The dielectric need not necessarily be reached as early as in the course of the first etching; if the initial width of the gate structure, i.e. the width of the upper gate layer 5, is large enough, it is also conceivable that, after the lower gate layer 3 has been reached, only the second etching uncovers the dielectric.

The etching gas A2 can preferably be selected in such a way that the second etching is also effected selectively with respect to the second gate layer 5 lying above the first gate layer 3 (and, if appropriate, with respect to the intermediate layer lying between them). In this case, T-shaped gate structures are produced whose readily conductive metallic upper part maintains its wider cross section formed after the first etching, while only the lower first gate layer 3 is narrowed. As a result, the upper gate layer 5 can be contact-connected more easily.

If the second etching is not selective with respect to the upper gate layer, although know T-shaped gate structures are produced, the same reduction of the initial gate length is nonetheless achieved in this case as well. Moreover, if the second gate layer 5 is deposited with a sufficient thickness, enough material of said layer also remains after the second etching in order to ensure a sufficient electrical conductivity of the gate and in order to reliably make contact with the gate.

A hydrogen halide preferably serves as etching gas A2 for the second etching, carried out isotropically. Hydrogen bromide (HBr), in particular, is highly suitable owing to its good selectivity with respect to silicon dioxide (as dielectric) and with respect to metals (as second gate layer).

In FIGS. 1 and 2, gate layer stacks of adjacent capacitors are shown closely adjacent in exaggerated proportion in order to better illustrate the influence of different degrees of isotropy on the shaping by the etching gas A2.

By contrast, FIG. 3 shows only a single fabricated T-shaped layer stack 3, 4, 5, which is already covered laterally with spacers 7. The spacers serve for laterally insulating the gate channel with respect to the source/drain implantations S/D to be introduced.

The implantations S/D are implanted outside the spacers 7 through the dielectric 2 into regions 8 of the substrate. During a subsequent thermal processing, the temperature and the duration of the action of heat are controlled in such a way that the ion profile 6 extends right under the upper gate layer 5 up to the lower gate layer 3, i.e. into the region 6a. Given a width of the original gate layer stack of 200 nm, an additional ion diffusion—corresponding to the undercutting—of 50 nm on each side of the gate suffices to form a transistor with a channel length of 100 nm. Preferably—proceeding from a gate width of 120 to 300 nm—the source/drain implantations are brought to one another to preferably 30 to 150 nm (corresponding to the desired channel length). According to the invention, however, it is possible to fabricate MOSFETs with any desired, even shorter channel length.

Such a transistor can be produced with the aid of conventional lithography methods by the method according to the invention.

The present invention makes it possible to fabricate self-aligned multilayer gates in which exclusively conventional fabrication installations and process steps are employed. The method is therefore simple and cost-effective, and the gate length of the transistors fabricated is particularly dimensionally accurate on account of the controlled undercutting.

We claim:

1. A method for fabricating a MOSFET with a gate channel of a predetermined, very small channel length, the method which comprises the following steps:

producing a dielectric on a semiconductor substrate;

applying a first gate layer to the dielectric, the first gate layer comprising polysilicon;

forming an intermediate layer, to serve as a diffusion barrier, on the first gate layer;

applying a second gate layer, the second gate layer comprising tungsten;

masking the second gate layer to define a width of the second gate layer to be greater than the predetermined channel length;

anisotropically etching the second gate layer, the intermediate layer, and the first gate layer;

isotropically laterally undercutting the first gate layer under the second gate layer selectively with respect to the dielectric, with respect to the intermediate layer, and with respect to the second gate layer, thereby utilizing an etching gas containing hydrogen bromide in a dry etching process, and controlling the etching process for forming the first gate layer with a predetermined width less than the width of the second gate layer and corresponding to the predetermined channel length.

2. The method according to claim 1, which comprises forming the diffusion barrier of tungsten nitride.

3. The method according to claim 1, which comprises controlling the width of the first gate layer by a width of the second gate layer and by a duration of the lateral undercutting of the first gate layer under the second gate layer.

4. The method according to claim 1, which comprises controlling a width of the first gate layer during the undercutting step by controlling a concentration of an etchant.

5. The method according to claim 1, wherein the predetermined width of the first gate layer is equal to the predetermined channel length.

6. The method according to claim 1, which comprises continuing the anisotropic etching of the second and first gate layers until the dielectric is reached.

7. The method according to claim 1, which comprises undercutting with an isotropic plasma etching step.

8. The method according to claim 1, wherein the width of the second gate layer is between 120 and 300 nm.

9. The method according to claim 1, wherein the width of the first gate layer is between 30 and 150 nm.

10. The method according to claim 1, wherein the gate dielectric comprises silicon dioxide.

11. The method according to claim 1, which comprises forming the second gate layer with a higher electrical conductivity than the first gate layer.

12. The method according to claim 1, which comprises introducing source/drain implantations and diffusing the implantations under the predetermined width of the second gate layer as far as an edge of the first gate layer.

13. The method according to claim 1, wherein the step of forming the intermediate layer encompasses subsequent silicidation.

* * * * *